(12) United States Patent
Jeong et al.

(10) Patent No.: US 8,153,267 B2
(45) Date of Patent: *Apr. 10, 2012

(54) COMPOSITION AND ORGANIC INSULATOR PREPARED USING THE SAME

(75) Inventors: Eun Jeong Jeong, Seongnam-si (KR); Hyun Sik Moon, Seoul (KR); Jung Seok Hahn, Seongnam-si (KR); Kyung Seok Son, Seoul (KR); Eun Kyung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 136 days.

This patent is subject to a terminal disclaimer.

(21) Appl. No.: 12/073,497

(22) Filed: Mar. 6, 2008

(65) Prior Publication Data

US 2008/0308793 A1    Dec. 18, 2008

(30) Foreign Application Priority Data

Jun. 12, 2007    (KR) .................. 10-2007-0057235

(51) Int. Cl.
*B32B 9/04* (2006.01)
(52) U.S. Cl. ............ 428/447; 528/17; 528/32; 525/100; 525/431; 525/446; 525/464; 525/476
(58) Field of Classification Search .................. None
See application file for complete search history.

(56) References Cited

U.S. PATENT DOCUMENTS

| | | | | |
|---|---|---|---|---|
| 4,386,130 A | * | 5/1983 | Hayashi et al. | 428/215 |
| 5,644,014 A | | 7/1997 | Schmidt et al. | |
| 5,973,067 A | * | 10/1999 | Nakamura et al. | 524/858 |
| 5,981,970 A | | 11/1999 | Dimitrakopoulos et al. | |
| 6,000,339 A | | 12/1999 | Matsuzawa | |
| 6,232,157 B1 | | 5/2001 | Dodabalapur et al. | |
| 6,468,589 B2 | * | 10/2002 | Nishikawa et al. | 427/385.5 |
| 6,723,487 B2 | * | 4/2004 | Minami et al. | 430/270.1 |
| 7,186,634 B2 | | 3/2007 | Yoneya | |
| 7,291,567 B2 | * | 11/2007 | Tsuchiya et al. | 438/761 |
| 2005/0259212 A1 | * | 11/2005 | Lee et al. | 349/183 |
| 2006/0041096 A1 | * | 2/2006 | Shin et al. | 528/9 |
| 2009/0004098 A1 | | 1/2009 | Schmidt et al. | |

FOREIGN PATENT DOCUMENTS

| | | |
|---|---|---|
| JP | 59-223441 | * 12/1984 |
| KR | 1020040037968 | 5/2004 |
| KR | 1020050004565 | 1/2005 |
| KR | 2005-036171 | 4/2005 |

OTHER PUBLICATIONS

Abstract for JP 59-223441 (1984).*
Url for the thin film transistor page of the "The World of Liquid Crystal Displays" @ http://www.personal.kent.edu/~mgu/LCD/tft.htm.*
C.D. Dimitrakopoulos et al., "Low-Voltage Organic Transistors on Plastic Comprising High-Dielectric Constant Gate Insulators," *Science*, vol. 283, pp. 822-824 (Feb. 5, 1999).
Korean Office Action dated Jul. 26, 2011.

* cited by examiner

*Primary Examiner* — Marc Zimmer
(74) *Attorney, Agent, or Firm* — Harness, Dickey & Pierce, P.L.C.

(57) ABSTRACT

Disclosed are a composition including a silane-based organic/inorganic hybrid material having a multiple bond and one or more organic metal compounds and/or one or more organic polymers, an organic insulator including the composition, an organic thin film transistor (OTFT) including the organic insulator and an electronic device including the OTFT. The organic insulator including the composition for preparing an organic insulator has increased charge mobility and an increased on/off current ratio, thus exhibiting improved properties, and the organic thin film transistor manifests uniform properties due to the absence of hysteresis.

15 Claims, 5 Drawing Sheets

COMPOSITION AND ORGANIC INSULATOR PREPARED USING THE SAME

PRIORITY STATEMENT

This non-provisional application claims priority under U.S.C. §119 to Korean Patent Application No. 10-2007-0057235, filed on Jun. 12, 2007, in the Korean Intellectual Property Office (KIPO), the entire contents of which are herein incorporated by reference.

BACKGROUND

1. Field

Example embodiments relate to a composition, an organic insulator prepared using the same, an organic thin film transistor, and an electronic device. Other example embodiments relate to a composition, which includes a silane-based organic/inorganic hybrid material having a multiple bond, one or more organic metal compounds, and/or one or more organic polymers, thus making it possible to uniformly exhibit improved electrical properties upon application thereof to the insulating layer of a thin film transistor, an organic insulator prepared using the same, an organic thin film transistor and an electronic device.

2. Description of the Related Art

A thin film transistor (TFT) may be used as a switching device for controlling the operation of each pixel and a driving device for driving each pixel in a flat panel display, for example, a liquid crystal display (LCD) or an electroluminescent display (ELD). In addition, the TFT may be used for smart cards or plastic chips for inventory tags.

The TFT may include a source region and a drain region doped with a dopant having a relatively high concentration, a semiconductor layer having a channel region formed between the two regions, a gate electrode positioned in the region corresponding to the channel region while being insulated from the semiconductor layer, and a source electrode and a drain electrode respectively brought into contact with the source region and the drain region.

The semiconductor layer of the TFT may be formed of an inorganic semiconductor material, for example, silicon (Si). However, according to the recent trend toward the fabrication of relatively large, inexpensive, and flexible displays, an expensive inorganic material, requiring a high-temperature vacuum process, with an organic semiconductor material may be needed. Thus, research into organic thin film transistors (OTFTS) using an organic film as the semiconductor layer is being conducted. Such an OTFT may be advantageous because printing may be conducted at atmospheric pressure unlike a conventional silicon process, for example, plasma-enhanced chemical vapor deposition, and furthermore, performing a roll-to-roll process using a plastic substrate may be possible, consequently realizing inexpensive transistors.

The OTFT may have charge mobility equal or greater than amorphous Si TFTS, but the driving voltage and threshold voltage thereof may be undesirably higher. Accordingly, research has been directed toward insulating films to control the driving voltage of the OTFT and to reduce the threshold voltage thereof.

In this regard, methods of forming an organic insulator through chemical vapor deposition, physical vapor deposition, sputtering, or sol-gel coating using inorganic metal oxide or a ferroelectric insulator are known. However, these methods may be disadvantageous because most processes are conducted at temperatures as high as about 200° C.~about 400° C., and thus, a plastic substrate for flexible displays may not be used. Further, upon the manufacture of devices, a conventional wet process including simple coating or printing may be difficult to implement, and furthermore, properties including charge mobility may remain unsatisfactory although the driving voltage decreases.

To overcome the above problems, an Si-based insulator containing an acryl group for improving charge mobility is disclosed in the related art. However, the TFT using the silane-based insulator containing the acryl group may undesirably cause hysteresis, in which the quantity of current varies depending on the magnitude of voltage, or over time.

SUMMARY

Accordingly, example embodiments provide a composition, which may impart improved electrical properties while preventing or reducing the generation of hysteresis in a TFT. Example embodiments also provide an organic insulator, which has increased charge mobility in conjunction with an organic semiconductor layer and may not cause hysteresis. Example embodiments also provide an OTFT and an electronic device including the same, in which hysteresis is not observed in the I-V graph of the TFT including the organic insulator according to example embodiments, and improved electrical properties may be exhibited.

According to example embodiments, a composition for preparing an organic insulator may include a silane-based organic/inorganic hybrid material having a multiple bond and one or more organic metal compounds and/or one or more organic polymers.

The organic silane compound having a multiple bond may be a material represented by Formula 1 or 2 below, or an organic/inorganic hybrid resin obtained by subjecting one or more selected from among materials of Formula 1 or 2 or a mixture of the one or more selected from among materials of Formula 1 or 2 and a material of Formula 3 to hydrolysis and condensation using an acid catalyst or a base catalyst and water in the presence of an organic solvent:

$$A_1SiX_1X_2X_3 \quad \text{Formula 1}$$

wherein $A_1$ is a $C_{2\sim30}$ alkenyl group, a $C_{2\sim30}$ alkynyl group, or a $C_{1\sim30}$ alkyl group, and
$X_1$, $X_2$ and $X_3$ are each independently a hydroxyl group, a halogen atom, or a $C_{1\sim5}$ alkoxy group;

$$A_1A_2SiX_1X_2 \quad \text{Formula 2}$$

wherein $A_1$ and $A_2$ each are a $C_{2\sim30}$ alkenyl group, a $C_{2\sim30}$ alkynyl group, or a $C_{1\sim30}$ alkyl group, and
$X_1$ and $X_2$ are each independently a hydroxyl group, a halogen atom, or a $C_{1\sim5}$ alkoxy group; and

$$SiX^1X^2X^3X^4 \quad \text{Formula 3}$$

wherein $X^1$, $X^2$, $X^3$ and $X^4$ are each independently a halogen atom, a hydroxyl group, or a $C_{1\sim5}$ alkoxy group.

According to example embodiments, an organic insulator may include the organic insulator composition mentioned above. According to example embodiments, an OTFT may include a substrate, a gate electrode, an insulating layer, an organic semiconductor layer, and a plurality of drain/source electrode pairs, in which the insulating layer is the organic insulator mentioned above.

BRIEF DESCRIPTION OF THE DRAWINGS

Example embodiments will be more clearly understood from the following detailed description taken in conjunction with the accompanying drawings. FIGS. 1-8 represent non-limiting example embodiments described herein.

FIG. 2 is a view illustrating the results of 29Si NMR of the organic/inorganic hybrid material synthesized in Synthesis Example 1;

FIG. 3 is a view illustrating the results of 29Si NMR of the organic/inorganic hybrid material synthesized in Synthesis Example 2;

FIG. 4 is a view illustrating the results of 29Si NMR of the organic/inorganic hybrid material synthesized in Synthesis Example 3; and FIGS. 5-8 are I-V graphs of the OTFTs manufactured in the comparative example, Example 1, Example 2 and Example 3, respectively.

Figure 1A:
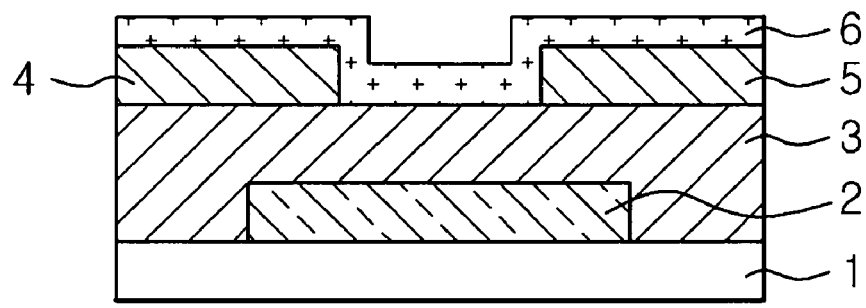
FIG. 1A-1C are schematic sectional views illustrating the bottom contact type OTFT, top contact type OTFT, and top gate type OTFT, respectively, according to example embodiments.

It should be noted that these figures are intended to illustrate the general characteristics of methods, structures and/or materials utilized in certain example embodiments and to supplement the written description provided below. These drawings are not, however, to scale, and may not precisely reflect the precise structural or performance characteristics of any given embodiment, and should not be interpreted as defining or limiting the range of values or properties encompassed by the example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the accompanying drawings. Example embodiments may, however, be embodied in many different forms and should not be construed as being limited to the embodiments set force herein. Rather, these embodiments are provided so that this disclosure will be thorough and complete, and will fully convey the scope of example embodiments to those skilled in the art.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, a composition for preparing an organic insulator may include a silane-based organic/inorganic hybrid material having a multiple bond and one or more organic metal compounds and/or one or more organic polymers. For example, the organic/inorganic hybrid material of the composition according to example embodiments may have a multiple bond, containing a double bond or a triple bond. Thus, one or more alkenyl or alkynyl groups may be included.

The organic insulator composition of the example embodiments may be used for the organic insulating layer of an OTFT. In the OTFT, because the properties thereof may be uniform, hysteresis may not take place. The term "hysteresis" means a phenomenon in which a predetermined or given physical quantity, for example, the magnitude of current between a source electrode and a drain electrode, is not simply determined only by a physical variable at the time, for example, the magnitude of voltage applied to a gate electrode, but depends on the change in the variable applied to the OTFT before the time.

Because a conventional silane-based organic/inorganic hybrid material containing an acryl group has lone-pair electrons, a molecular structure for constituting a complex with an organic metal compound may undesirably cause hysteresis. However, in the composition for preparing an organic insulator according to the example embodiments, the organic/inorganic hybrid material may be a material containing a double bond or a triple bond in which a hetero atom including oxygen or nitrogen is not present, and thus makes it possible to prevent or reduce the generation of hysteresis in the TFT, such that the TFT may exhibit more uniform properties.

In example embodiments, the silane-based organic/inorganic hybrid material having a multiple bond is an organic silane compound having a multiple bond or a polymer obtained by subjecting the organic silane compound having a multiple bond to hydrolysis and condensation in the presence of an acid catalyst or a base catalyst. For example, the organic silane compound having a multiple bond may be an organic/inorganic hybrid resin obtained by subjecting a material represented by Formula 1 or 2 below to hydrolysis and condensation using an acid catalyst or a base catalyst and water in the presence of an organic solvent. Alternatively, the organic silane compound having a multiple bond may be a copolymer resin obtained by subjecting one or more selected from among the compounds of Formula 1 or 2 and the material of Formula 3 to hydrolysis and condensation using an acid catalyst or a base catalyst and water in the presence of an organic solvent.

$$A_1SiX_1X_2X_3 \qquad \text{Formula 1}$$

wherein $A_1$ is a $C_{2\sim30}$ alkenyl group, a $C_{2\sim30}$ alkynyl group, or a $C_{1\sim30}$ alkyl group, and $X_1$, $X_2$ and $X_3$ are each independently a hydroxyl group, a halogen atom, or a $C_{1\sim5}$ alkoxy group.

$$A_1A_2SiX_1X_2 \qquad \text{Formula 2}$$

wherein $A_1$ and $A_2$ each are a $C_{2\sim30}$ alkenyl group, a $C_{2\sim30}$ alkynyl group, or a $C_{1\sim30}$ alkyl group, and $X_1$ and $X_2$ are each independently a hydroxyl group, a halogen atom, or a $C_{1\sim5}$ alkoxy group.

$$SiX^1X^2X^3X^4 \qquad \text{Formula 3}$$

wherein $X^1$, $X^2$, $X^3$ and $X^4$ are each independently a halogen atom, a hydroxyl group, or a $C_{1\sim5}$ alkoxy group.

The acid catalyst or the base catalyst used in the preparation of the organic/inorganic hybrid resin may include one or more selected from the group consisting of hydrochloric acid, nitric acid, benzene sulfonic acid, oxalic acid, formic acid, potassium hydroxide, sodium hydroxide, triethylamine, sodium bicarbonate, and pyridine. The amount thereof may be set such that the molar ratio of the total amount of a monomer, represented by Formula 1 or 2, to the amount of the catalyst falls in the range from about 1:0.000001 to about 1:10. The amount of water used in the hydrolysis and condensation may be set such that the molar ratio of the monomer, represented by Formula 1 or 2, to water falls in the range from about 1:1 to about 1:1000.

In the organic insulator composition according to the example embodiments, as the organic/inorganic hybrid material, a silane-based organic/inorganic hybrid material having a multiple bond, which includes different types of alkenyl or alkynyl groups, may be provided in the form of a mixture, or alternatively a copolymer of silane-based organic/inorganic hybrid material having different types of alkenyl group may be provided. Further, the organic/inorganic hybrid material may include a material obtained by copolymerizing a silane compound having a double bond or a triple bond with another silane compound having no double bond and no triple bond. In such a copolymer, $A_1$ and $A_2$ may include a hydrogen atom, a $C_{1\sim30}$ alkyl group, or a $C_{3\sim30}$ cycloalkyl group, in addition to the multiple bond.

Examples of the organic/inorganic hybrid resin having a multiple bond may include a polymer represented by Formula 4 below:

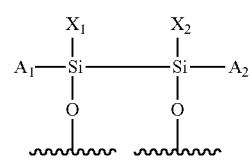

Formula 4 wherein $A_1$ and $A_2$ are each independently one or more $C_{2\sim30}$ alkenyl groups, one or more $C_{2\sim30}$ alkynyl groups, or one or more $C_{1\sim30}$ alkyl groups, $X_1$ and $X_2$ are each independently a hydroxyl group, a halogen atom, or a $C_{1\sim5}$ alkoxy group, and m and n are each independently an integer from about 0 to about 1000, in which m+n is an integer greater than 1.

In Formula 4, the alkenyl group of $A_1$ and $A_2$ may include vinyl, allyl, hexenyl, or octenyl. Examples of the organic/inorganic hybrid material having a multiple bond usable in the organic insulator composition may include, but are not limited to, compounds represented by Formulas 5 to 7 below:

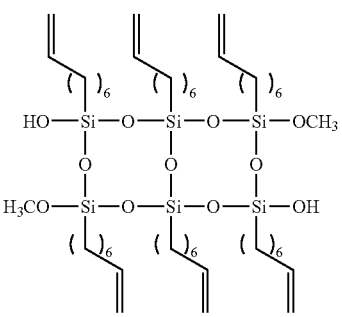

Formula 5

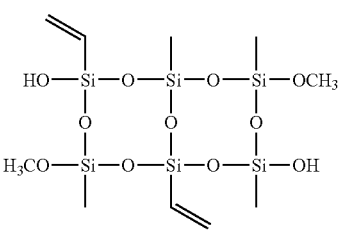

Formula 6

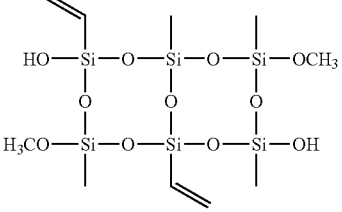

Formula 7

The molecular weight of the organic/inorganic hybrid resin having a multiple bond according to the example embodiments is not particularly limited, but may range from about 500 to about 300,000.

According to the example embodiments, the composition for preparing an organic insulator may include either one or more organic metal compounds or one or more organic polymers, or alternatively both one or more organic metal compounds and one or more organic polymers, in addition to the organic/inorganic hybrid material having a multiple bond.

The organic metal compound may include metal oxide, having improved dielectric properties and a higher dielectric constant. Specific examples thereof may include, but are not limited to, titanium compounds, including titanium (IV) n-butoxide, titanium (IV) t-butoxide, titanium (IV) ethoxide, titanium (IV) 2-ethylhexoxide, titanium (IV) iso-propoxide, titanium (IV) (di-iso-propoxide)bis(acetylacetonate), titanium (IV) oxide bis(acetylacetonate), trichlorotris(tetrahydrofuran) titanium (III), tris(2,2,6,6-tetramethyl-3,5-heptanedionato) titanium (III), (trimethyl)pentamethylcyclopentadienyl titanium (IV), pentamethylcyclopentadienyltitanium trichloride (IV), pentamethylcyclopentadienyltitanium trimethoxide (IV), tetrachlorobis(cyclohexylmercapto)titanium (IV), tetrachlorobis(tetrahydrofuran)titanium (IV), tetrachlorodiamine titanium (IV), tetrakis(diethylamino)titanium (IV), tetrakis(dimethylamino) titanium (IV), bis(t-butylcyclopentadienyl)titanium dichloride, bis(cyclopentadienyl)dicarbonyl titanium (II), bis(cyclopentadienyl)titanium dichloride, bis(ethylcyclopentadienyl)titanium dichloride, bis(pentamethylcyclopentadienyl)titanium dichloride bis(iso-propylcyclopentadienyl) titanium dichloride, tris(2,2,6,6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptanedionato) titanium (IV), dimethylbis(t-butylcyclopentadienyl)titanium (IV), and di(iso-propoxide)bis(2,2,6,6-tetramethyl-3,5-heptanedionato) titanium (IV), a zirconium compound, including zirconium (IV) n-butoxide, zirconium (IV) t-butoxide, zirconium (IV) ethoxide, zirconium (IV) iso-propoxide, zirconium (IV) n-propoxide, zirconium (IV) acetylacetonate, zirconium (IV) hexafluoroacetylacetonate, zirconium (IV) trifluoroacetylacetonate, tetrakis(diethylamino)zirconium, tetrakis(dimethylamino)zirconium, tetrakis(2,2,6,6-tetramethyl-3,5-heptanedionato) zirconium (IV), and zirconium (IV) sulfate tetrahydrate, a hafnium compound, including hafnium (IV) n-butoxide, hafnium (IV) t-butoxide, hafnium (IV) ethoxide, hafnium (IV) iso-propoxide, hafnium (IV) iso-propoxide monoisopropylate, hafnium (IV) acetylacetonate, and tetrakis(dimethylamino)hafnium, and an aluminum compound, including aluminum n-butoxide, aluminum t-butoxide, aluminum s-butoxide, aluminum ethoxide, aluminum iso-propoxide, aluminum acetylacetonate, aluminum hexafluoroacetylacetonate, aluminum trifluoroacetylacetonate, and tris (2,2,6,6-tetramethyl-3,5-heptanedionato)aluminum.

The amount of the organic metal compound added to the composition according to the example embodiments may be about 1~about 300 parts by weight, for example, about 5~about 100 parts by weight, based on about 100 parts by weight of the silane-based organic/inorganic hybrid material having a multiple bond. When the amount of the organic metal compound exceeds about 300 parts by weight, excessive or increased leakage current may occur, undesirably decreasing the on/off current ratio and charge mobility. On the other hand, when the amount is less than about 1 part by weight, forming a thin film may be difficult, and charge mobility may decrease.

Specific examples of the organic polymer usable herein may include, but are not limited to, polyester, polycarbonate, polyvinylalcohol, polyvinylbutyral, polyacetal, polyarylate, polyamide, polyamideimide, polyetherimide, polyphenylene ether, polyphenylene sulfide, polyethersulfone, polyetherketone, polyphthalamide, polyethernitrile, polyethersulfone, polybenzimidazole, polycarbodiimide, polysiloxane, polymethylmethacrylate, polymethacrylamide, nitrile rubber, acryl rubber, polyethylene tetrafluoride, epoxy resin, phenol resin, melamine resin, urea resin, polybutene, polypentene, poly (ethylene-co-propylene), poly(ethylene-co-butene diene), polybutadiene, polyisoprene, poly(ethylene-co-propylene diene), butyl rubber, polymethylpentene, polystyrene, poly (styrene-co-butadiene), hydrogenated poly(styrene-co-butadiene), hydrogenated polyisoprene, hydrogenated polybutadiene, and combinations thereof.

The amount of the organic polymer compound, which is added to the composition for preparing an organic insulator, may be about 0.01~about 50 parts by weight, for example, about 0.1~about 25 parts by weight, based on about 100 parts by weight of the silane-based organic/inorganic hybrid material having a multiple bond. When the amount of the organic polymer compound exceeds about 50 parts by weight, the properties of the electronic device including the organic insulating film prepared using the composition for preparing an organic insulator according to example embodiments may deteriorate. On the other hand, when the amount is less than about 0.01 parts by weight, the formation of a thin film through spin coating may be difficult.

In the composition according to example embodiments, the amounts of the silane-based organic/inorganic hybrid material having a multiple bond and the organic metal compound and/or the organic polymer may be adjusted in order to control the dielectric constant and the leakage current of an organic insulator prepared therefrom.

The composition for preparing an organic insulator according to example embodiments may further include a solvent for dissolving the silane-based organic/inorganic hybrid material having a multiple bond, and one or more organic metal compounds and/or one or more organic polymers.

Examples of the solvent usable herein may include, but are not limited to, an aliphatic hydrocarbon solvent, including hexane, an aromatic hydrocarbon solvent, including anisol, mesitylene, and xylene, a ketone-based solvent, including methyl isobutyl ketone, 1-methyl-2-pyrrolidinone, and acetone, an ether-based solvent, including cyclohexanone, tetrahydrofuran, and isopropyl ether, an acetate-based solvent, including ethyl acetate, butyl acetate, and propylene glycol methyl ether acetate, an alcohol-based solvent, including isopropyl alcohol and butyl alcohol, an amide-based solvent including dimethylacetamide and dimethylformamide, a silicon-based solvent, or mixtures thereof.

Where the organic insulator composition according to example embodiments is applied on a substrate, the solvent may be included in an amount sufficient to achieve the concentration required to coat the substrate with the solid components, for example, the silane-based organic/inorganic hybrid material having a multiple bond and the organic metal compound and/or the organic polymer. For example, the solvent may be included in an amount of about 100 to about 2000 parts by weight, based on about 100 parts by weight of the silane-based organic/inorganic hybrid material having a multiple bond. When the amount of the solvent is less than about 100 parts by weight, the solid components may not be completely dissolved. On the other hand, when the amount of the solvent exceeds about 2000 parts by weight, a thin film may be formed to a thickness as low as about 1000 Å or less.

In addition, example embodiments provide an organic insulator including the organic insulator composition mentioned above. The organic insulator according to example embodiments may have improved dielectric properties, and the OTFT using the same may have increased charge mobility, decreased driving voltage and threshold voltage, and an increased on-off current ratio ($I_{on}/I_{off}$). For example, while the insulating film may be prepared through a typical wet process, including printing or spin coating, the performance thereof may be equal to that of an inorganic film, which may be formed only through a complicated process including chemical vapor deposition.

The organic insulator according to example embodiments may be prepared by applying the composition for preparing an organic insulator on a substrate, and curing the composition. This organic insulating layer may be prepared through any method among conventional wet coating methods. For example, a coating process including spin coating, dip coating, roll coating, screen coating, spray coating, spin casting, flow coating, screen printing, ink jetting, or drop casting, for example, spin coating, may be used. Where spin coating is conducted, the spin rate may be regulated in the range from about 400 rpm to about 4000 rpm. The curing for forming the organic insulator may be conducted by heating the substrate at about 70° C.~about 200° C. for a time period ranging from about 30 minutes to about 2 hours. However, these curing conditions may vary depending on the type of the organic insulating polymer or the composition of the organic insulating layer.

The organic insulator according to example embodiments may be applied to various electronic devices. For example, the organic insulator may be used as the insulating layer of an OTFT. According to example embodiments, the OTFT may be variously applied to plastic-based devices, for example, active driving elements of organic electroluminescent devices, smart cards, and plastic chips for inventory tags.

In addition, example embodiments provide an OTFT, including a substrate, a gate electrode, a gate insulating layer, an organic semiconductor layer, and drain/source electrodes, in which the gate insulating layer is the organic insulator mentioned above.

Figure 1B:
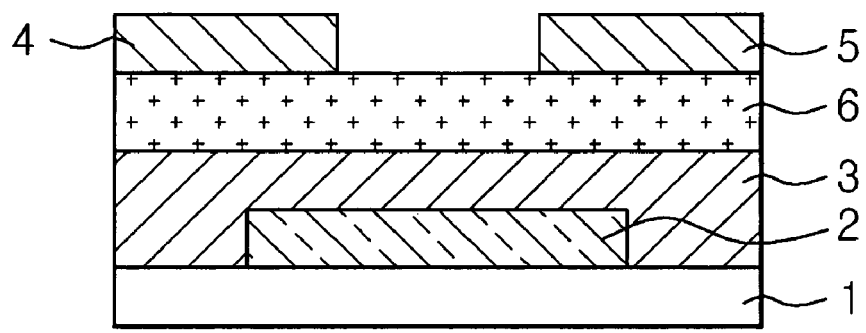
Figure 1C:
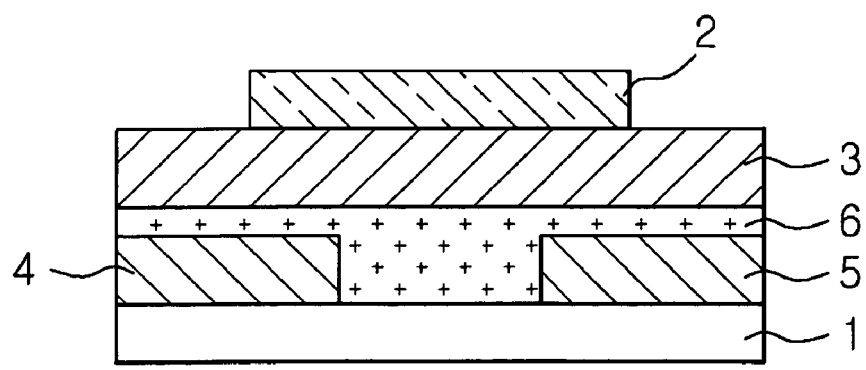

The structure of the OTFT according to example embodiments may not be particularly limited, and a predetermined or given structure, including a top contact structure, a bottom contact structure, or a top gate structure, may be provided. Examples of the structure of the OTFT which may be prepared using the organic insulator according to example embodiments are schematically illustrated in FIGS. 1A-1C. FIG. 1A is a schematic sectional view illustrating the bottom contact type OTFT, FIG. 1B is a schematic sectional view illustrating the top contact type OTFT, and FIG. 1C is a schematic sectional view illustrating the top gate type OTFT.

For instance, the OTFT according to example embodiments may have either a structure in which a gate electrode 2, a gate insulating layer 3, source/drain electrodes 4, 5, and an organic semiconductor layer 6 are sequentially formed on a substrate 1, as illustrated in FIG. 1A, or a structure in which a gate electrode 2, a gate insulating layer 3, an organic semiconductor layer 6, and source/drain electrodes 4, 5 are sequentially formed on a substrate 1, as illustrated in FIG. 1B. Also, as shown in FIG. 1C, the OTFT of example embodiments may have a structure in which source/drain electrodes 4, 5, an organic semiconductor layer 6, a gate insulating layer 3, and a gate electrode 2 may be sequentially layered on a substrate 1.

Examples of the material for the substrate may include, but are not limited to, plastic, glass, silicon, polyethylenenaphthalate (PEN), polyethyleneterephthalate (PET), polycarbonate, polyvinylbutyral, polyacrylate, polyimide, polynorbornene, and polyethersulfone (PES).

The organic semiconductor layer may be formed of typically known materials, specific examples of which may include, but are not limited to, pentacene, copper phthalocyanine, polythiophene, polyaniline, polyacetylene, polypyrrole, polyphenylene vinylene, or derivatives thereof.

The OTFT according to example embodiments may be advantageous because a thin film may be formed using a wet process (print coating, spin coating and/or bar coating) at atmospheric pressure, instead of conventional plasma-enhanced chemical vapor deposition for forming an Si thin film, and furthermore, performing a roll-to-roll process using a plastic substrate may be possible, resulting in inexpensive TFTs.

For the gate electrode and the source/drain electrodes, conventional metals may be used, and specific examples thereof may include, but are not limited to, gold (Au), silver (Ag), aluminum (Al), nickel (Ni), indium tin oxide (ITO), molybdenum (Mo), and tungsten (W).

A better understanding of example embodiments may be obtained in light of the following examples, which are set forth to illustrate, but are not to be construed to limit the example embodiments.

Synthesis Example 1

Synthesis of OETS

Figure 2:
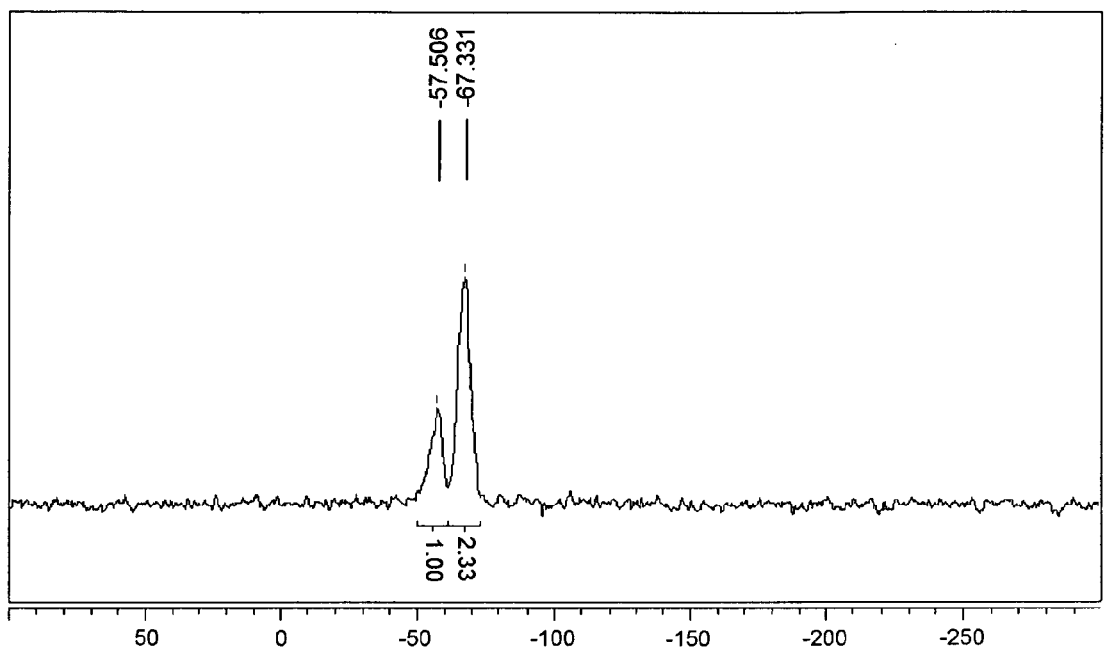

7-Octenyltrimethoxysilane (about 100 g, about 0.43 mol) was loaded into a flask, and about 3.5 ml of a solution obtained by diluting about 1.29 ml of about 1 N HCl in about 77.4 ml of deionized water in a bath at about −30° C. was added. Subsequently, the solution was allowed to react and stirred at about room temperature for about 24 hours. After the completion of the reaction, the resultant solution was transferred into a separate funnel and was then washed about three times with water (about 30 ml), after which the organic layer was dried over $MgSO_4$ and then filtered, thus obtaining a polymer. The polymer thus obtained was dissolved in about 15 ml of acetone. This solution was filtered using a filter having a pore size of about 0.2 μm to remove fine powder and impurities, after which the transparent solution portion was treated under reduced pressure to remove volatile material, thereby obtaining about 60 g of OETS in a colorless liquid state, represented by Formula 5 below. The results of Si NMR (400 MHz) of the compound thus obtained are shown in FIG. 2.

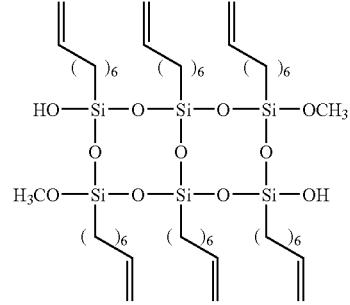

Formula 5

Synthesis Example 2

Synthesis of MVTS

Methyltrimethoxysilane (about 30 g, about 220 mmol) and vinyltrimethoxysilane (about 6.53 g, about 44 mmol) were loaded into a flask, and were then slowly added with about 1

Figure 3:
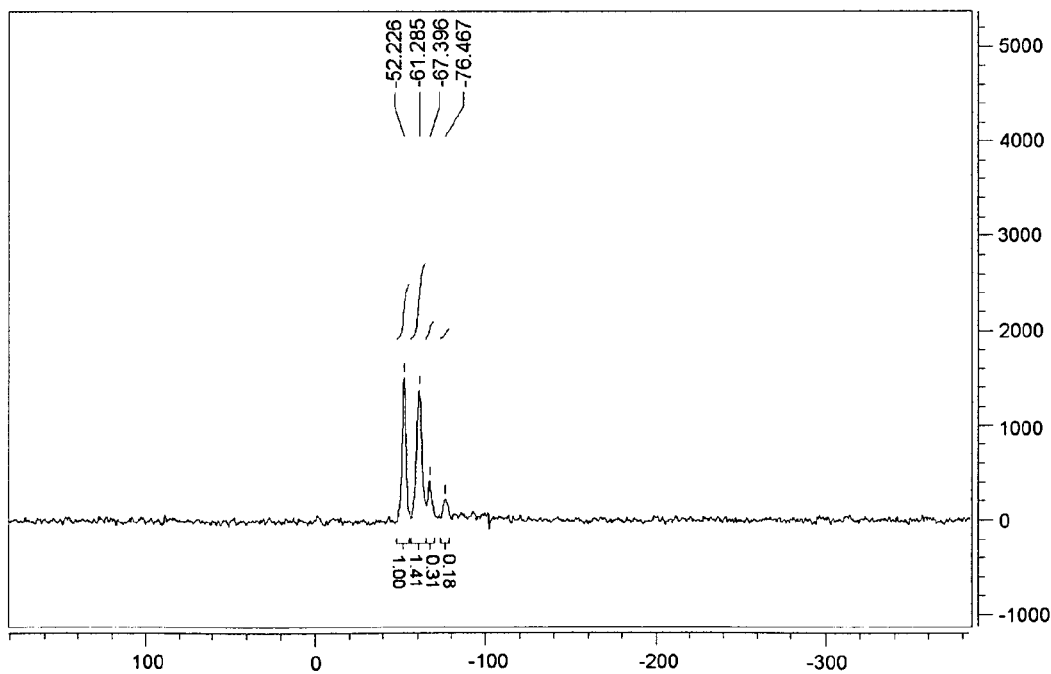

N HCl (about 0.79 ml) and about 47.55 ml of water in a bath at about −30° C. The solution was stirred at about room temperature for about 24 hours and was then washed with a sufficient amount of water. The organic layer was dried over MgSO$_4$, filtered, distilled under reduced pressure to remove the solvent, and then dried in a vacuum, thus obtaining the compound represented by Formula 6 below. The results of Si NMR (400 MHz) of the compound thus obtained are shown in FIG. 3.

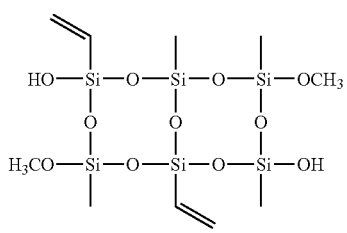

Formula 6

Synthesis Example 3

Synthesis of MATS

Figure 4:
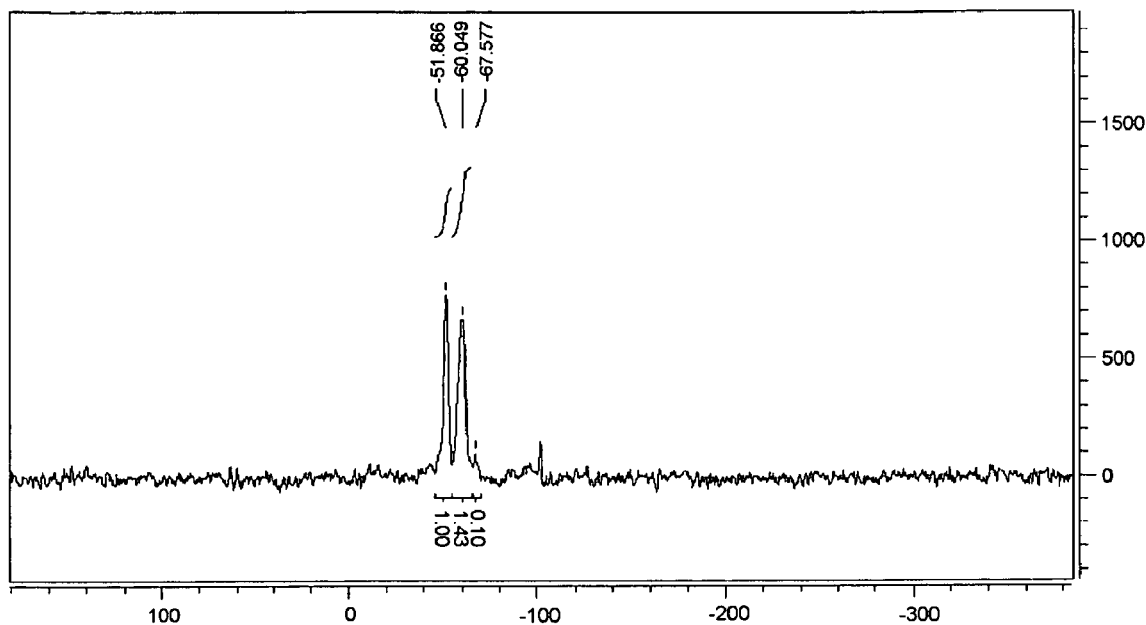

Methyltrimethoxysilane (about 30 g, about 0.22 mmol) and allyltrimethoxysilane (about 7.14 g, about 44 mmol) were loaded into a flask, and were then slowly added with about 1 N HCl (about 0.79 ml) and about 47.55 ml of water in a bath at about −30° C. The solution was stirred at about room temperature for about 24 hours and was then washed with a sufficient amount of water. The organic layer was dried over MgSO$_4$, filtered, distilled under reduced pressure to remove the solvent, and then dried in a vacuum, thus obtaining the compound represented by Formula 7 below. The results of Si NMR (400 MHz) of the compound thus obtained are shown in FIG. 4.

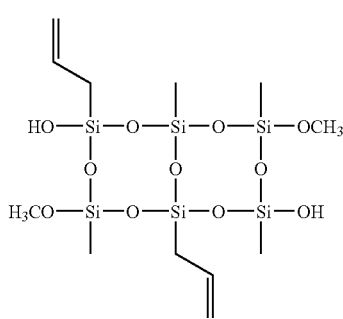

Formula 7

Example 1

As a silane-based organic/inorganic hybrid material having a multiple bond, about 1 g of the OETS obtained in Synthesis Example 1 was mixed with, as an organic metal compound, about 0.15 g of tetrabutoxy titanate (Ti(OC$_4$H$_9$)$_4$), and the mixture was dissolved in about 4 g of butanol, thus preparing a mixture solution for an organic insulator.

Al/Nd, useful for a gate electrode, were deposited to a thickness of about 1000 Å on a cleaned glass substrate via sputtering. Subsequently, the mixture solution for an organic insulator was applied thereon through spin coating at about 1500 rpm for about 50 seconds, pre-annealed at about 70° C. for about 2 minutes, and baked at about 200° C. for about 1 hour, thus forming an organic insulating layer about 600 nm thick.

On the insulating layer thus obtained, an about 1 wt % solution of polythiophene in chlorobenzene was applied through spin coating at about 1000 rpm for about 30 seconds, and was then thermally treated at about 100° C. for about 10 minutes to thus form a film about 500 Å thick, thereby forming an organic semiconductor layer of polythiophene about 700 Å thick. Forming the organic semiconductor layer was conducted under conditions of a vacuum of about $2 \times 10^{-6}$ torr, a substrate temperature of about 80° C., and a deposition rate of about 0.3 Å/sec.

Au was deposited to a thickness of about 70 nm on the organic semiconductor layer through sputtering using a shadow mask having a channel length of about 100 μm and a channel width of about 1 mm, thus forming source/drain electrodes, consequently manufacturing an OTFT. The electrical properties of OTEF were evaluated, and the results thereof are given in the following Table 1.

Example 2

An OTFT was manufactured in the same manner as in Example 1, with the exception that the MVTS obtained in Synthesis Example 2 was used as the organic/inorganic hybrid material having a multiple bond upon the preparation of the mixture solution for an organic insulator. The electrical properties of the OTEF were evaluated, and the results thereof are given in the following Table 1.

Example 3

An OTFT was manufactured in the same manner as in Example 1, with the exception that the MATS obtained in Synthesis Example 3 was used as the organic/inorganic hybrid material having a multiple bond upon the preparation of the mixture solution for an organic insulator. The electrical properties of the OTEF were evaluated, and the results thereof are given in the following Table 1.

Comparative Example

An OTFT was manufactured in the same manner as in Example 1, with the exception that TPM (trialkoxysilylpropyl methacrylate) was used upon the preparation of the mixture solution for an organic insulator. The electrical properties of the OTEF were evaluated, and the results thereof are given in the following Table 1.

Experimental Example

In order to evaluate the electrical properties of the OTFTs according to example embodiments, using a Keithley semiconductor analyzer (4200-SCS), the driving properties, including charge mobility and on-off current ratio, of the OTFTs obtained in Examples 1~3 and Comparative Example were measured as follows. The results of the measurements of the properties of the OTFTs are shown in Table 1 below.

1) Charge Mobility

The charge mobility was calculated using the following current equation for the saturation region. For example, the current equation was converted into a graph of $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is the source-drain current, $\mu$ or $\mu_{FET}$ is the charge mobility, $C_O$ is the oxide film capacitance, W is the channel width, L is the channel length, $V_G$ is the gate voltage, and $V_T$ is the threshold voltage.

2) On/Off Current Ratio

The on/off current ratio was taken from the ratio of maximum current in the on-state to minimum current in the off-state, and was represented by the following equation:

$$\frac{I_{on}}{I_{off}} = \left(\frac{\mu}{\sigma}\right)\frac{C_0^2}{qN_A t^2}V_D^2$$

wherein $I_{on}$ is the maximum current, $I_{off}$ is the off-state leakage current, $\mu$ is the charge mobility, $\sigma$ is the conductivity of the thin film, q is the quantity of the electric charge, $N_A$ is the density of the electric charge, t is the thickness of the semiconductor film, $C_o$ is the oxide film capacitance, and $V_D$ is the drain voltage.

Figure 5:
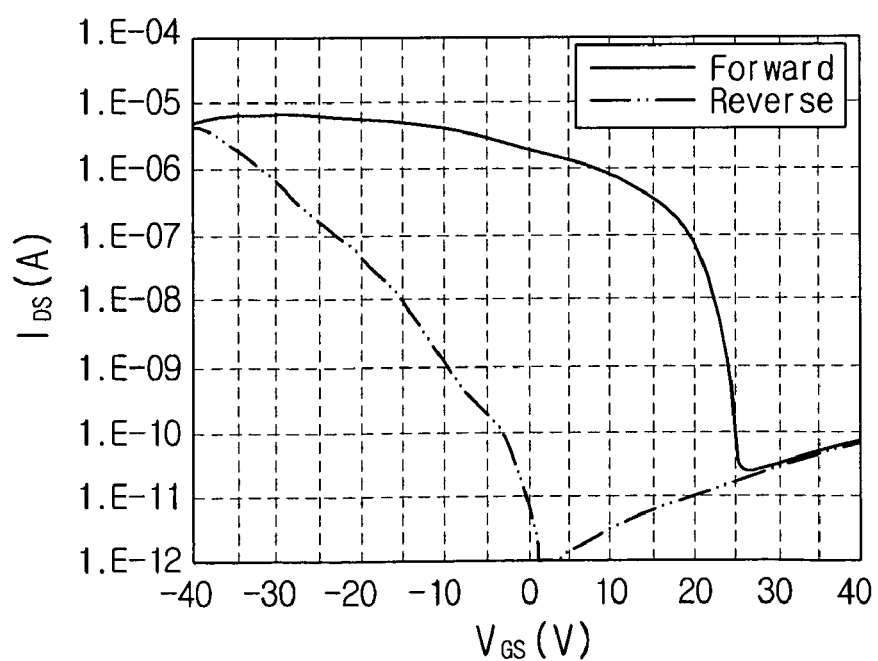
Figure 6:
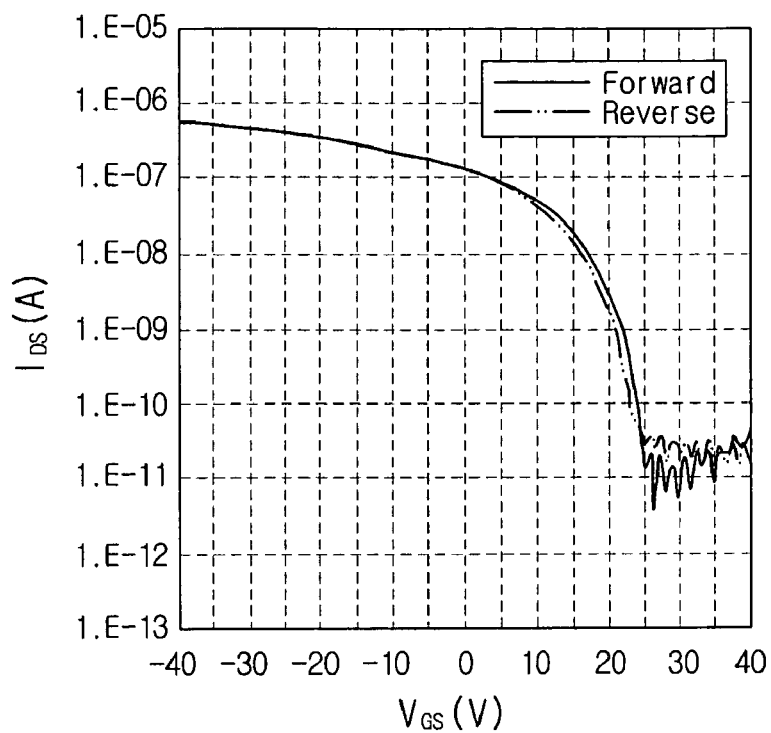
Figure 7:
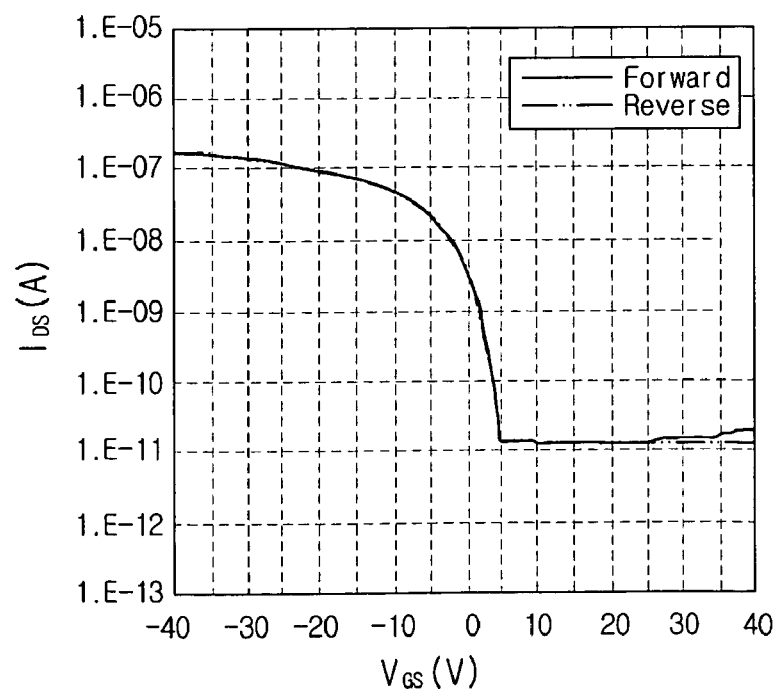
Figure 8:
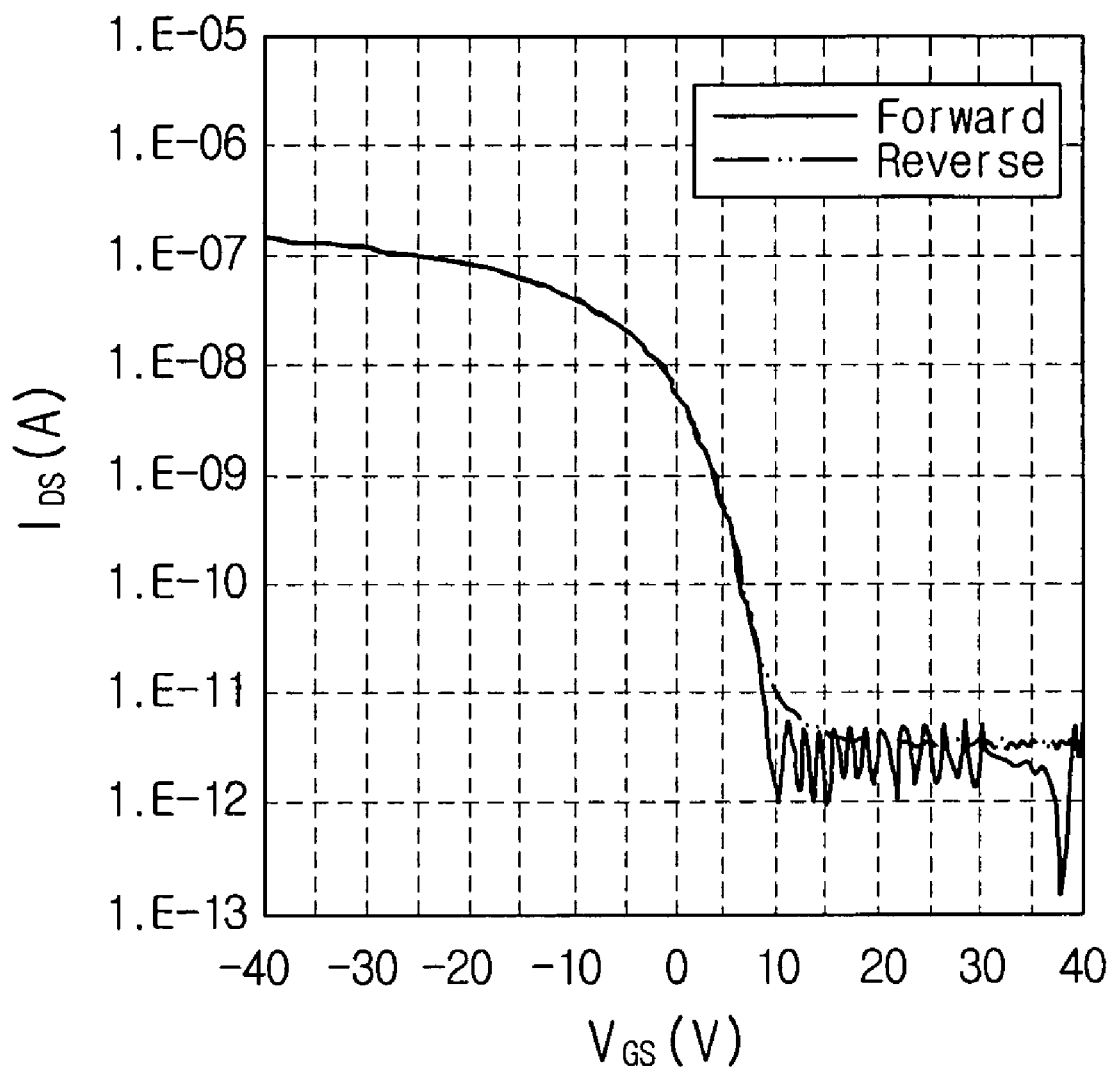

The I-V properties of the OTFTs of Comparative Example and Examples 1~3 were measured. The results are shown in FIGS. 5 to 8. As a result, the OTFTs of Examples 1~3 (FIGS. 6~8) exhibited almost no hysteresis behavior, unlike the case of the comparative example (FIG. 5).

TABLE 1

| | $I_{on}$ (A) | $I_{off}$ (A) | Charge Mobility (cm²/Vs) | Hysteresis (V) |
|---|---|---|---|---|
| C. Ex. | 6.3 × 10⁻⁶ | <10⁻¹² | 0.3 | >25 |
| Ex. 1 | 6.1 × 10⁻⁷ | 2.8 × 10⁻¹¹ | 0.03 | 1 |
| Ex. 2 | 1.5 × 10⁻⁷ | 1.1 × 10⁻¹¹ | 0.012 | 1 |
| Ex. 3 | 1.4 × 10⁻⁷ | 8.08 × 10⁻¹² | 0.013 | 0.5 |

As is apparent from Table 1, in the comparative example using the silane-based organic/inorganic hybrid resin having an acryl group, hysteresis of about 25 V or more was observed. However, in Examples 1~3 using the silane-based organic/inorganic hybrid resin having a multiple bond according to example embodiments, the forward current and the backward current, flowing depending on the change in voltage, were the same as each other, and thus there was no difference between the forward voltage and the backward voltage, resulting in hysteresis of about 0.

As described hereinbefore, example embodiments provide a composition and an organic insulator prepared using the same. According to the example embodiments, when the organic insulator is used as the insulating layer of the OTFT, prevention or reduction of hysteresis and increased charge mobility may be possible, and furthermore, formation may be conducted through a wet process, thus contributing to simplifying the preparation process and decreasing the preparation cost, and consequently may be useful for the manufacture of an OTFT.

Although example embodiments have been disclosed for illustrative purposes, those skilled in the art will appreciate that various modifications, additions and substitutions are possible, without departing from the scope and spirit of the accompanying claims.

What is claimed is:

1. A composition for preparing an organic insulator, comprising:

a silane-based organic/inorganic hybrid material having a multiple bond; and one or more organic metal compounds and one or more organic polymers, and wherein the silane-based organic/inorganic hybrid material having a multiple bond is a compound represented by Formula 1 or 2 below, or an organic/inorganic hybrid resin obtained by subjecting a compound of Formula 1 or 2, or one or more selected from among materials of Formula 1 or 2 and a material of Formula 3, to hydrolysis and condensation using an acid catalyst or a base catalyst and water in presence of an organic solvent:

A₁SiX₁X₂X₃     Formula 1 wherein A1 is an octenyl group or a C2~30 alkynyl group, and X1, X2 and X3 are each independently a hydroxyl group, a halogen atom, or a C1~5 alkoxy group;

A₁A₂SiX₁X₂     Formula 2 wherein A1 and A2 each are a hexenyl group, an octenyl group, or a C2~30 alkynyl group, and X1 and X2 are each independently a hydroxyl group, a halogen atom, or a C1~5 alkoxy group; and SiX₁X₂X₃X₄     Formula 3 wherein X1, X2, X3 and X4 are each independently a halogen atom, a hydroxyl group, or a C1~5 alkoxy group.

2. The compound as set forth in claim 1, wherein the silane-based organic/inorganic hybrid material having a multiple bond is a resin represented by Formula 4 below:

Formula 4

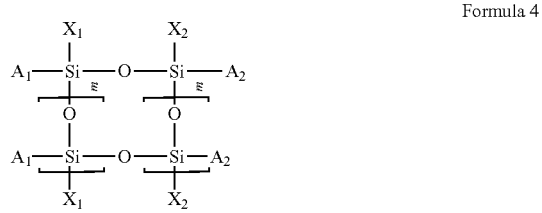

wherein $A_1$ and $A_2$ are each independently an octenyl group or a C2~30 alkynyl group, $X_1$ and $X_2$ are each independently a hydroxyl group, a halogen atom, or a $C_{1~5}$ alkoxy group, and where m is an integer from about 0 to about 1000.

3. The compound as set forth in claim 1, wherein the silane-based organic/inorganic hybrid material having a multiple bond is a material represented by Formulas 5 below:

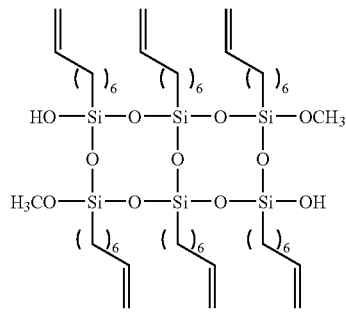

Formula 5

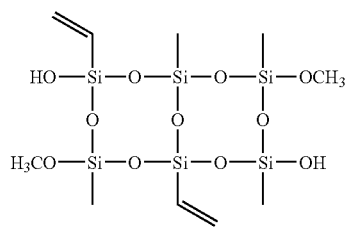

Formula 6

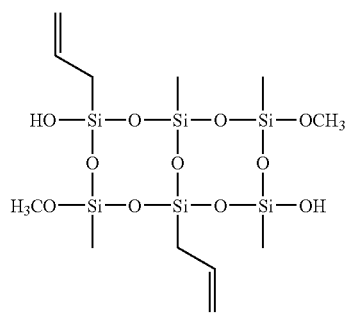

Formula 7

4. The composition as set forth in claim 1, wherein the organic metal compound is selected from a group consisting of a titanium compound, a zirconium compound, a hafnium compound, an aluminum compound, and mixtures thereof.

5. The composition as set forth in claim 4, wherein the organic metal compound is selected from a group consisting of titanium (IV) n-butoxide, titanium (IV) t-butoxide, titanium (IV) ethoxide, titanium (IV) 2-ethylhexoxide, titanium (IV) iso-propoxide, titanium (IV) (di-iso-propoxide)bis(acetylacetonate), titanium (IV) oxide bis(acetylacetonate), trichlorotris(tetrahydrofuran) titanium (III), tris(2,2,6,6-tetramethyl-3,5-heptanedionato) titanium (III), (trimethyl)pentamethyl-cyclopentadienyl titanium (IV), pentamethylcyclopentadienyltitanium trichloride (IV), pentamethylcyclopentadienyltitanium trimethoxide (IV), tetrachlorobis(cyclohexylmercapto) titanium (IV), tetrachlorobis(tetrahydrofuran) titanium (IV), tetrachlorodiamine titanium (IV), tetrakis(diethylamino) titanium (IV), tetrakis(dimethylamino) titanium (IV), bis(t-butylcyclopentadienyl) titanium dichloride, bis(cyclopentadienyl)dicarbonyl titanium (II), bis(cyclopentadienyl) titanium dichloride, bis(ethylcyclopentadienyl) titanium dichloride, bis(pentamethylcyclopentadienyl) titanium dichloride, bis(isopropylcyclopentadienyl)titanium dichloride, tris(2,2,6,6-tetramethyl-3,5-heptanedionato)oxotitanium (IV), chlorotitanium triisopropoxide, cyclopentadienyltitanium trichloride, dichlorobis(2,2,6,6-tetramethyl-3,5-heptanedionato) titanium (IV), dimethylbis(t-butylcyclopentadienyl) titanium (IV), di(isopropoxide)bis(2,2,6,6-tetramethyl-3,5-heptanedionato) titanium (IV), zirconium (IV) n-butoxide, zirconium (IV) t-butoxide, zirconium (IV) ethoxide, zirconium (IV) iso-propoxide, zirconium (IV) n-propoxide, zirconium (IV) acetylacetonate, zirconium (IV) hexafluoroacetylacetonate, zirconium (IV) trifluoroacetylacetonate, tetrakis(diethylamino) zirconium, tetrakis(dimethylamino) zirconium, tetrakis(2,2,6,6-tetramethyl-3,5-heptanedionato) zirconium (IV), zirconium (IV) sulfate tetrahydrate, hafnium (IV) n-butoxide, hafnium (IV) t-butoxide, hafnium (IV) ethoxide, hafnium (IV) iso-propoxide, hafnium (IV) iso-propoxide monoisopropylate, hafnium (IV) acetylacetonate, tetrakis(dimethylamino) hafnium, aluminum n-butoxide, aluminum t-butoxide, aluminum s-butoxide, aluminum ethoxide, aluminum iso-propoxide, aluminum acetylacetonate, aluminum hexafluoroacetylacetonate, aluminum trifluoroacetylacetonate, tris(2,2,6,6-tetramethyl-3,5-heptanedionato) aluminum, and combinations thereof.

6. The composition as set forth in claim 1, wherein the organic metal compound is used in an amount of about 1~about 300 parts by weight based on about 100 parts by weight of the silane-based organic/inorganic hybrid material having a multiple bond.

7. The composition as set forth in claim 1, wherein the organic polymer is selected from a group consisting of polyester, polycarbonate, polyvinylalcohol, polyvinylbutyral, polyacetal, polyarylate, polyamide, polyamideimide, polyetherimide, polyphenylene ether, polyphenylene sulfide, polyethersulfone, polyetherketone, polyphthalamide, polyethernitrile, polyethersulfone, polybenzimidazole, polycarbodiimide, polysiloxane, polymethylmethacrylate, polymethacrylamide, nitrile rubber, acryl rubber, polyethylene tetrafluoride, epoxy resin, phenol resin, melamine resin, urea resin, polybutene, polypentene, poly(ethylene-co-propylene), poly(ethylene-co-butene diene), polybutadiene, polyisoprene, poly(ethylene-co-propylene diene), butyl rubber, polymethylpentene, polystyrene, poly(styrene-co-butadiene), hydrogenated poly(styrene-co-butadiene), hydrogenated polyisoprene, hydrogenated polybutadiene, and combinations thereof.

8. The composition as set forth in claim 1, wherein the organic polymer is used in an amount of about 0.01~about 50 parts by weight based on about 100 parts by weight of the silane-based organic/inorganic hybrid material having a multiple bond.

9. The composition as set forth in claim 1, further comprising:
a solvent for dissolving the silane-based organic/inorganic hybrid material having a multiple bond and the one or more organic metal compounds and/or the one or more organic polymers.

10. The composition as set forth in claim 9, wherein the solvent is an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, or a mixture thereof.

11. The composition as set forth in claim 9, wherein the solvent is used in an amount of about 100~about 2000 parts by weight based on about 100 parts by weight of the silane-based organic/inorganic hybrid material having a multiple bond.

12. An organic insulator derived from the composition of claim 1.

13. An organic thin film transistor, comprising:
a substrate, a gate electrode, an insulating layer, an organic semiconductor layer, and a plurality of drain/source electrode pairs, wherein the insulating layer is the organic insulator of claim 12.

14. An electronic device comprising the organic thin film transistor of claim 13.

15. The electronic device as set forth in claim 14, wherein the electronic device is a liquid crystal display, a photovoltaic device, an organic light-emitting device, a sensor, memory, or an integrated circuit.

\* \* \* \* \*